US012580553B2

(12) United States Patent
Onishi

(10) Patent No.:  US 12,580,553 B2
(45) Date of Patent:  Mar. 17, 2026

(54) APPARATUS, METHOD, AND PROGRAM FOR POWER STABILIZATION THROUGH ARITHMETIC PROCESSING OF DUMMY DATA

(71) Applicant: NEC Corporation, Tokyo (JP)

(72) Inventor: Masashi Onishi, Tokyo (JP)

(73) Assignee: NEC Corporation, Tokyo (JP)

( * ) Notice: Subject to any disclaimer, the term of this patent is extended or adjusted under 35 U.S.C. 154(b) by 1147 days.

(21) Appl. No.: 17/494,944

(22) Filed: Oct. 6, 2021

(65) Prior Publication Data

US 2022/0116025 A1     Apr. 14, 2022

(30) Foreign Application Priority Data

Oct. 13, 2020     (JP) ................................. 2020-172329

(51) Int. Cl.
*H03H 17/02*          (2006.01)
*H03H 17/00*          (2006.01)

(52) U.S. Cl.
CPC ..... *H03H 17/02* (2013.01); *H03H 2017/0081* (2013.01)

(58) Field of Classification Search
CPC ........ G06F 7/5443; G06F 7/57; G06F 9/3001; G06F 17/10; H03H 21/0012; H03H 17/02; H03H 17/06; H03H 17/14; H03H 17/0294; H03H 17/0225; H03H 17/04; H04L 25/03038; H04L 25/03057; H04B 2001/0425
See application file for complete search history.

(56) References Cited

U.S. PATENT DOCUMENTS

| | | | | |
|---|---|---|---|---|
| 4,903,019 | A | * | 2/1990 | Ito ....................... H03H 17/0685 |
| | | | | 341/61 |
| 8,559,482 | B1 | * | 10/2013 | Dong ................. H03H 17/0286 |
| | | | | 375/140 |
| 9,542,982 | B1 | * | 1/2017 | Nguyen ................... G11C 7/20 |
| 11,288,189 | B2 | * | 3/2022 | Jin ....................... G06F 12/0804 |
| 2002/0109882 | A1 | * | 8/2002 | Araki ..................... H04L 49/50 |
| | | | | 398/101 |

(Continued)

FOREIGN PATENT DOCUMENTS

| | | |
|---|---|---|
| JP | S64-61114 A | 3/1989 |
| JP | H01-241949 A | 9/1989 |

(Continued)

OTHER PUBLICATIONS

JP Office Action for JP Application No. 2020-172329, mailed on Jul. 30, 2024 with English Translation.

*Primary Examiner* — Emily E Larocque
*Assistant Examiner* — Maria De Jesus Rivera
(74) *Attorney, Agent, or Firm* — Sughrue Mion, PLLC

(57)          ABSTRACT

An arithmetic processing apparatus according to the present disclosure includes a digital filter. The arithmetic processing apparatus further includes a dummy data input unit configured to input dummy data to the digital filter when there is no input data input to the digital filter. The arithmetic processing apparatus further includes a cancellation processing unit configured to perform, on output data output from the digital filter, arithmetic processing for canceling an output component caused by the dummy data.

7 Claims, 8 Drawing Sheets

(56)        References Cited

U.S. PATENT DOCUMENTS

| | | | | |
|---|---|---|---|---|
| 2013/0067144 A1* | 3/2013 | Namba | G06F 3/065 | |
| | | | | 711/E12.001 |
| 2015/0085907 A1* | 3/2015 | Cooper | H04M 11/066 | |
| | | | | 375/222 |
| 2017/0311327 A1* | 10/2017 | Tanaka | H04W 74/02 | |
| 2018/0083607 A1* | 3/2018 | Kanomata | G06F 1/04 | |

FOREIGN PATENT DOCUMENTS

| | | | |
|---|---|---|---|
| JP | 2002-358639 A | 12/2002 | |
| JP | 2004-007088 A | 1/2004 | |
| JP | 2008-072164 A | 3/2008 | |
| JP | 2012-244553 A | 12/2012 | |

* cited by examiner

APPARATUS, METHOD, AND PROGRAM FOR POWER STABILIZATION THROUGH ARITHMETIC PROCESSING OF DUMMY DATA

INCORPORATION BY REFERENCE

This application is based upon and claims the benefit of priority from Japanese patent application No. 2020-172329, filed on Oct. 13, 2020, the disclosure of which is incorporated herein in its entirety by reference.

TECHNICAL FIELD

The present disclosure relates to an arithmetic processing unit, a method, and a program.

BACKGROUND ART

In communication of a cellular telephone or the like, a Time Division Multiplex (TDM) system in which digital signals are temporally divided and the divided signals are multiplexed may be used. In the case of the TDM system, for example, at the beginning of the downlink communication, when an input to a filter in the uplink communication is stopped, a high-voltage current may instantaneously flow through a power supply line.

In recent years, a semiconductor chip such as a Field Programmable Gate Array (FPGA), which has started to be used for a mobile device such as a cellular telephone, has a large scale circuit and uses a large number of digital filters such as Finite Impulse Response (FIR) filters. In such a case, there is a problem such as a rapid increase or decrease of power consumption when a filter circuit is switched to be used or not used. In order to solve this problem, it is necessary to operate an arithmetic unit provided in a filter having a large power consumption even when the arithmetic unit is not in use, and thereby smooth (i.e., stabilize) the power consumption. Patent Literature 1 (Japanese Unexamined Patent Application Publication No. 2008-072164) discloses a technique related to a dummy data generation circuit that outputs dummy data from a dummy data table when data is not input for a predetermined period of time.

However, in the case of a hard macro into which a filter circuit is incorporated as hardware, an internal circuit cannot be changed in accordance with the intended use. For example, even when the arithmetic unit is operated, it is often not possible to take measures such as cutting off only its output and thereby eliminating the influence of its output on the filter output. Further, when dummy data is input from the outside like in the case of Patent Literature 1, it is necessary to additionally provide an arithmetic circuit for canceling the influence of inputting the dummy data on the output. At this time, it is necessary to perform design while taking into consideration the current consumed by the arithmetic circuit additionally provided. Further, although it is possible to smooth (i.e., stabilize) the consumption current by providing a dummy circuit in accordance with the power consumption of the arithmetic circuit, it is difficult to do so when the scale of the dummy circuit is large. Therefore, it is difficult to prevent, without using an arithmetic circuit or the like additionally provided, a rapid increase or decrease in a current in a device using a large number of digital filters.

An object of the present disclosure is to provide an arithmetic processing apparatus, a method, and a program for solving the above-described problem.

SUMMARY

An arithmetic processing apparatus according to the present disclosure comprises: a digital filter; a dummy data input unit configured to input dummy data to the digital filter when there is no input data input to the digital filter; and a cancellation processing unit configured to perform, on output data output from the digital filter, arithmetic processing for canceling an output component caused by the dummy data.

An arithmetic processing method according to the present disclosure comprises: inputting dummy data to a digital filter when there is no input data input to the digital filter; and performing, on output data output from the digital filter, arithmetic processing for canceling an output component caused by the dummy data.

A program according to the present disclosure causes an arithmetic processing apparatus to: input dummy data to a digital filter when there is no input data input to the digital filter; and perform, on output data output from the digital filter, arithmetic processing for canceling an output component caused by the dummy data.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENT

Figure 1:
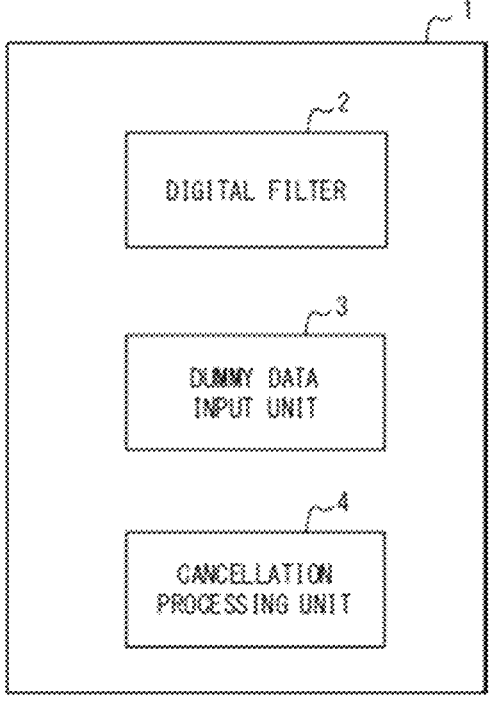
FIG. 1 is a block diagram of an arithmetic processing apparatus according to a first example embodiment of the present disclosure.

Example embodiments will be described hereinafter with reference to the drawings. Note that since the drawings are drawn in a simplified manner, the technical scope of the example embodiments should not be narrowly interpreted based on the descriptions of the drawings. Further, the same elements are denoted by the same reference numerals or symbols, and redundant descriptions will be omitted.

In the following example embodiments, when necessary, the present disclosure is explained by using separate sections or separate example embodiments. However, those example embodiments are not unrelated with each other, unless otherwise specified. That is, they are related in such a manner that one example embodiment is a modified example, an application example, a detailed example, or a supplementary example of a part or the whole of another example embodiment. Further, in the following example embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following example embodiments, their components (including operation steps and the like) are not necessarily indispensable except for cases where the component is explicitly specified or the component is obviously indispensable based on its principle. Similarly, in the following example embodiments, when a shape, a position relation, or the like of a component(s) or the like is mentioned, shapes or the likes that are substantially similar to or resemble that shape are also included in that shape except for cases where it is explicitly specified or they are eliminated based on its principle. This is also true for the above-described number or the like (including numbers, values, quantities, ranges, and the like).

First Example Embodiment

The configuration of an arithmetic processing apparatus 1 according to this example embodiment will be described with reference to FIG. 1. FIG. 1 is a block diagram of the arithmetic processing apparatus 1 according to this example embodiment.

The arithmetic processing apparatus 1 according to this example embodiment includes a digital filter 2, a dummy data input unit 3, and a cancellation processing unit 4. As the digital filter 2, various types of digital filters such as a Finite Impulse Response (FIR) filter and an Infinite Impulse Response (IIR) filter can be used.

The dummy data input unit 3 inputs dummy data to the digital filter 2 when there is no input data input to the digital filter 2.

The cancellation processing unit 4 performs, on output data output from the digital filter 2, arithmetic processing for canceling an output component caused by the dummy data input by the dummy data input unit 3.

According to the arithmetic processing apparatus 1 according to this example embodiment, it is possible to prevent a rapid increase or decrease in a current in a device using a large number of digital filters.

Second Example Embodiment

Figure 2:
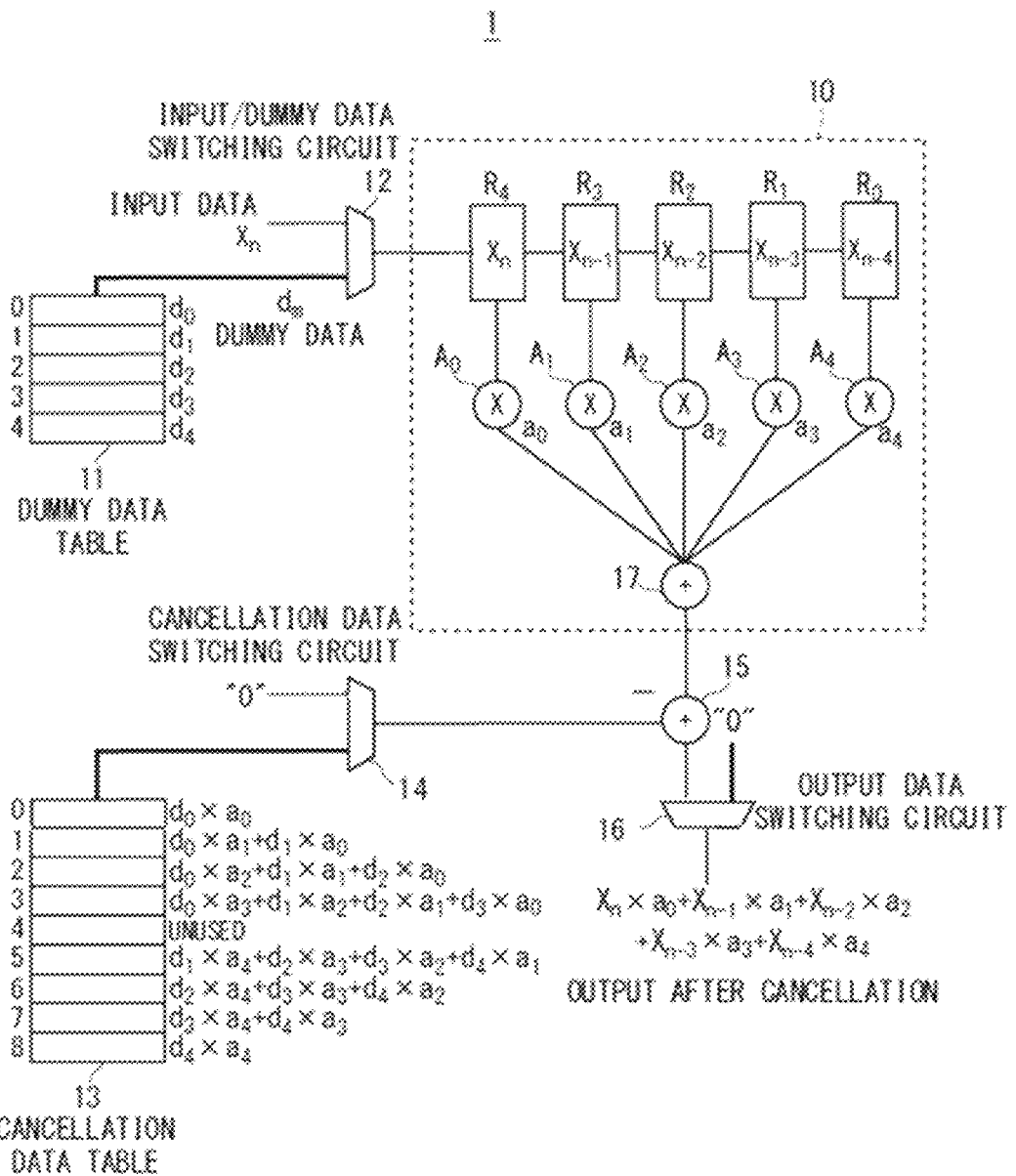
FIG. 2 is a block diagram of an arithmetic processing apparatus according to a second example embodiment of the present disclosure.

The configuration of the arithmetic processing apparatus 1 according to this example embodiment will be described with reference to FIG. 2. FIG. 2 is a block diagram of the arithmetic processing apparatus 1 according to this example embodiment.

FIG. 2 shows a configuration example of the arithmetic processing apparatus 1 according to this example embodiment. In this example embodiment, the arithmetic processing apparatus 1 includes an FIR filter 10.

When there is no data input to the FIR filter 10, dummy data $d_m$ stored in a dummy data table 11 is input to the FIR filter 10. Further, an input/dummy data switching circuit 12 for selecting either input data $X_n$ or dummy data $d_m$ input from the dummy data table 11 is provided in an input unit of the FIR filter 10.

A cancellation data table 13 stores cancellation data used for arithmetic processing for canceling an output component from the FIR filter 10 caused by dummy data. Further, a cancellation data switching circuit 14 that selects either data "0" or cancellation data input from the cancellation data table 13 is provided.

An adder 15 for cancellation that adds data output from the cancellation data switching circuit 14 to data output from the FIR filter 10 is provided in an output unit of the FIR filter 10. An output data switching circuit 16 that selects either data input from the adder 15 for cancellation or "0" is further provided in the output unit.

Note that although the digital filter is described as being the FIR filter 10 in this example embodiment, various types of digital filters such as an IIR filter can instead be used as the digital filter.

Here, a configuration example of the FIR filter 10 according to this example embodiment will be described. As shown in FIG. 2, in this example embodiment, the number of taps of the FIR filter 10 is five. Note that the number of taps of the FIR filter 10 is not limited to five. Further, the FIR filter 10 includes delay elements $R_0$ to $R_4$, multipliers $A_0$ to $A_4$, and an in-filter adder 17. The multipliers $A_0$ to $A_4$ are connected to the delay elements $R_0$ to $R_4$, respectively. A logic circuit such as a D-type flip-flop is used for the delay elements $R_0$ to $R_4$.

Data $X_n$ to $X_{n-4}$ output from the input/dummy data switching circuit 12 are stored in the delay elements $R_0$ to $R_4$, respectively. The input data is delayed by one unit time in the order of delay elements $R_4$, $R_3$, $R_2$, $R_1$, and $R_0$, and then input to the respective multipliers $A_0$, $A_1$, $A_2$, $A_3$, and $A_4$.

The multiplier $A_0$ multiplies the data $X_n$ stored in the delay element $R_4$ by a tap coefficient $a_0$, and outputs the data that has been subjected to the coefficient multiplication to the in-filter adder 17. The multiplier $A_1$ multiplies the data $X_{n-1}$ delayed by one unit time by a tap coefficient $a_1$, and outputs the data that has been subjected to the coefficient multiplication to the in-filter adder 17. The multiplier $A_2$ multiplies the data $X_{n-2}$ delayed by two unit times by a tap coefficient $a_2$, and outputs the data that has been subjected to the coefficient multiplication to the in-filter adder 17. The multiplier $A_3$ multiplies the data $X_{n-3}$ delayed by three unit times by a tap coefficient $a_3$, and outputs the data that has been subjected to the coefficient multiplication to the in-filter adder 17. The multiplier $A_4$ multiplies the data $X_{n-4}$ delayed by four unit times by a tap coefficient $a_4$, and outputs the data that has been subjected to the coefficient multiplication to the in-filter adder 17.

The adder 17 obtains the data output from the FIR filter 10 by adding all the data that has been subjected to the coefficient multiplication and that is output from each of the multipliers $A_0$ to $A_4$.

As shown in FIG. 2, the input/dummy data switching circuit 12 is provided in the input unit of the FIR filter 10. When there is no input data $X_n$ input to the FIR filter 10, dummy data $d_m$ is input from the dummy data table 11.

As shown in FIG. 2, the adder 15 for cancellation that cancels an output component caused by dummy data that is generated by a computation inside the FIR filter 10 is provided in the output unit of the FIR filter 10. The cancellation data table 13 includes data for canceling an output component caused by dummy data. When it is necessary to cancel an output component caused by dummy data, the cancellation data switching circuit 14 selects data from the cancellation data table 13 and outputs the selected data to the adder 15 for cancellation. At this time, the adder 15 for cancellation subtracts the output from the FIR filter 10 by using the data input from the cancellation data switching circuit 14.

The output data switching circuit 16 selects zero as output data when the dummy data pieces $d_m$ are stored respectively in the delay elements of the FIR filter 10.

Figure 7:
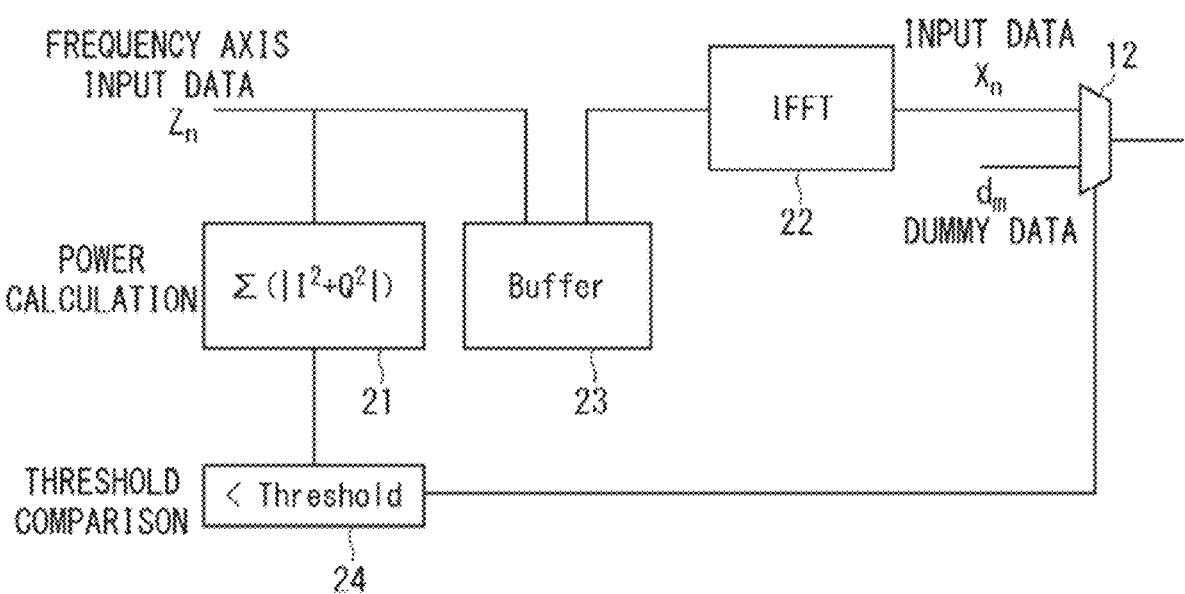
FIG. 7 is a block diagram of a control circuit according to the second example embodiment of the present disclosure.

A configuration of an Orthogonal Frequency Division Multiplexing (OFDM) signal generation unit 20 that determines whether or not dummy data $d_m$ is input to the FIR filter 10 will be described below with reference to FIG. 7. FIG. 7 is a diagram showing the configuration of the OFDM signal generation unit 20 according to this example embodiment.

When the input/dummy data switching circuit 12 can clearly determine the timing at which the input data $X_n$ becomes zero, the input/dummy data switching circuit 12 selects the dummy data $d_m$ and outputs the selected data in accordance with this timing. However, when the input/dummy data switching circuit 12 cannot determine the timing at which the input data $X_n$ becomes zero, a power calculation unit 21 of the OFDM signal generation unit 20 calculates power of an input signal.

As shown in FIG. 7, the OFDM signal generation unit 20 includes the power calculation unit 21, an Inverse Fast Fourier Transform (IFFT) unit 22, a buffer unit 23, and a threshold comparison unit 24. The OFDM signal generation unit 20 is provided on the input side of the FIR filter 10.

As shown in FIG. 7, the OFDM signal generation unit 20 includes the buffer unit 23 on the input side of the IFFT unit 22. The OFDM signal generation unit 20 transmits an input signal to the buffer unit 23. The IFFT unit 22 performs inverse Fourier transform processing on a certain number of signal samples (e.g., for one OFDM symbol). At this time, the power calculation unit 21 calculates a signal power of the input signal input via the buffer unit 23. A threshold is set for the signal power of the input signal calculated by the power calculation unit 21, and the threshold comparison unit 24 determines whether or not the signal power is equal to or less than the threshold. When the threshold comparison unit 24 determines that the power is equal to or less than the threshold, the input/dummy data switching circuit 12 selects the dummy data $d_m$ and outputs the selected data.

Description of Operation of Arithmetic Processing Unit According to this Example Embodiment An operation of the arithmetic processing apparatus 1 according to this example embodiment will be described in time series with reference to FIG. 3 to 6 in accordance with states of data pieces of the respective delay elements $R_0$ to $R_4$ of the FIR filter 10.

In FIG. 2, one sample of input data $X_n$ has been input at a time. At this time, the input/dummy data switching circuit 12 selects the data $X_n$ and outputs the selected data. Further, the cancellation data switching circuit 14 selects zero and outputs it.

Here, an output y(n) of the FIR filter 10 of which the number of taps is N is as shown in the following Expression (1). Note that N=5 in this example embodiment. In Expression (1), $a_k$ represents a tap coefficient and $x_{n-k}$ represents input data.

[Expression 1]

$$y(n) = \sum_{k=0}^{N-1} a_k x_{n-k} \qquad (1)$$

Figure 3:
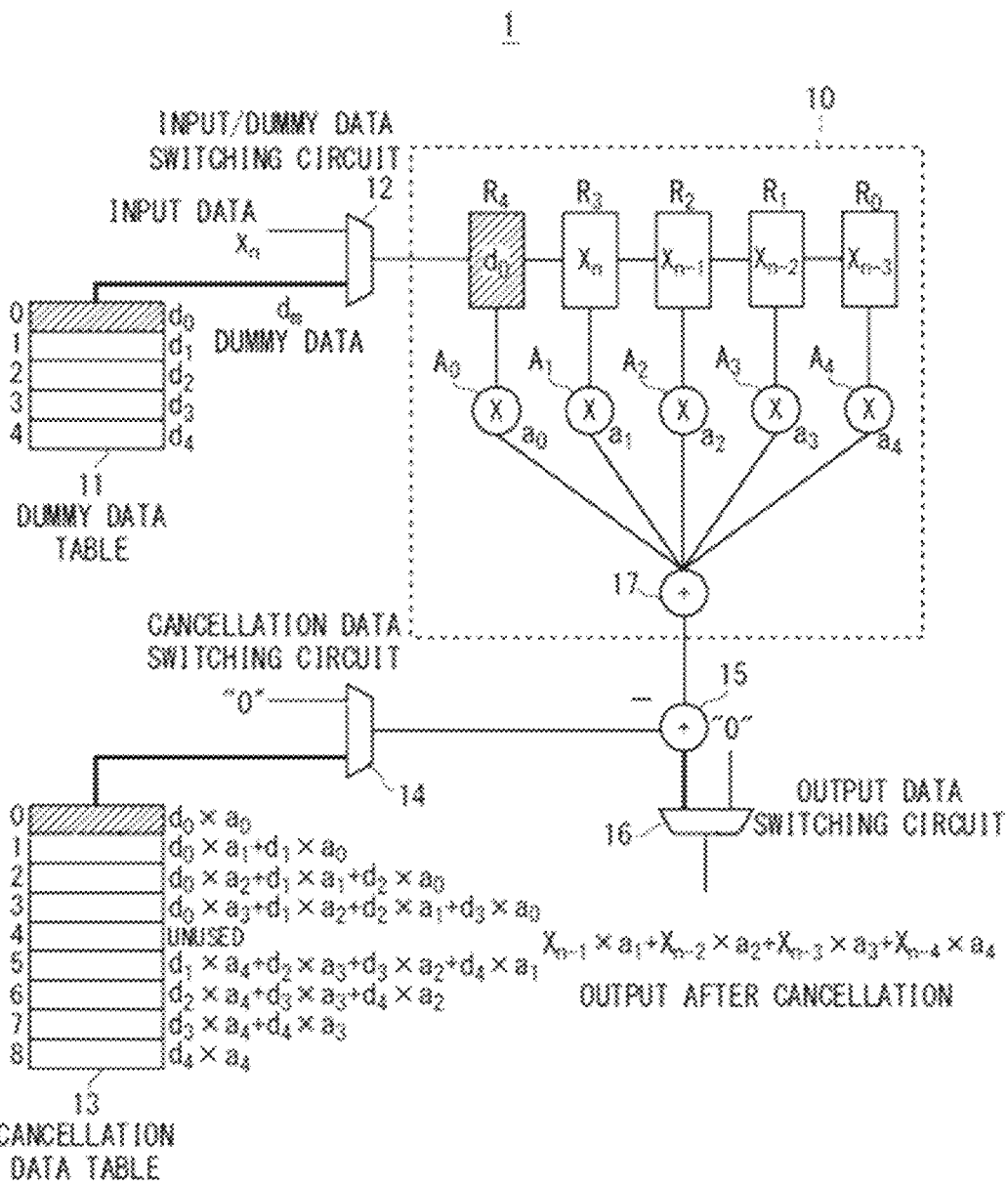
FIG. 3 is a diagram showing an operation of the arithmetic processing apparatus according to the second example embodiment of the present disclosure.

FIG. 3 shows a case in which the input data becomes zero. At this time, since there is no input data, the input/dummy data switching circuit 12 selects dummy data do and outputs the selected data. At this time, the dummy data do is stored in the delay element $R_4$ of the FIR filter 10. At this time, the cancellation data switching circuit 14 outputs cancellation data $d_0 \times a_0$ from the cancellation data table 13 to the adder 15 for cancellation, performs a subtraction from the output from the FIR filter 10, and cancels the output component caused by the dummy data.

A data table(n) for cancellation stored in the cancellation data table 13 is as shown in the following Expression (2). Note that n=0 to (N×2−1). In Expression (2), $d_{n-k}$ is data used as a dummy. Note that $d_{n-k}$ is not zero if (n−k)<N, and is zero otherwise.

[Expression 2]

$$\text{table }(n) = \sum_{k=0}^{N-1} a_k d_{n-k} \qquad (2)$$

Figure 4:
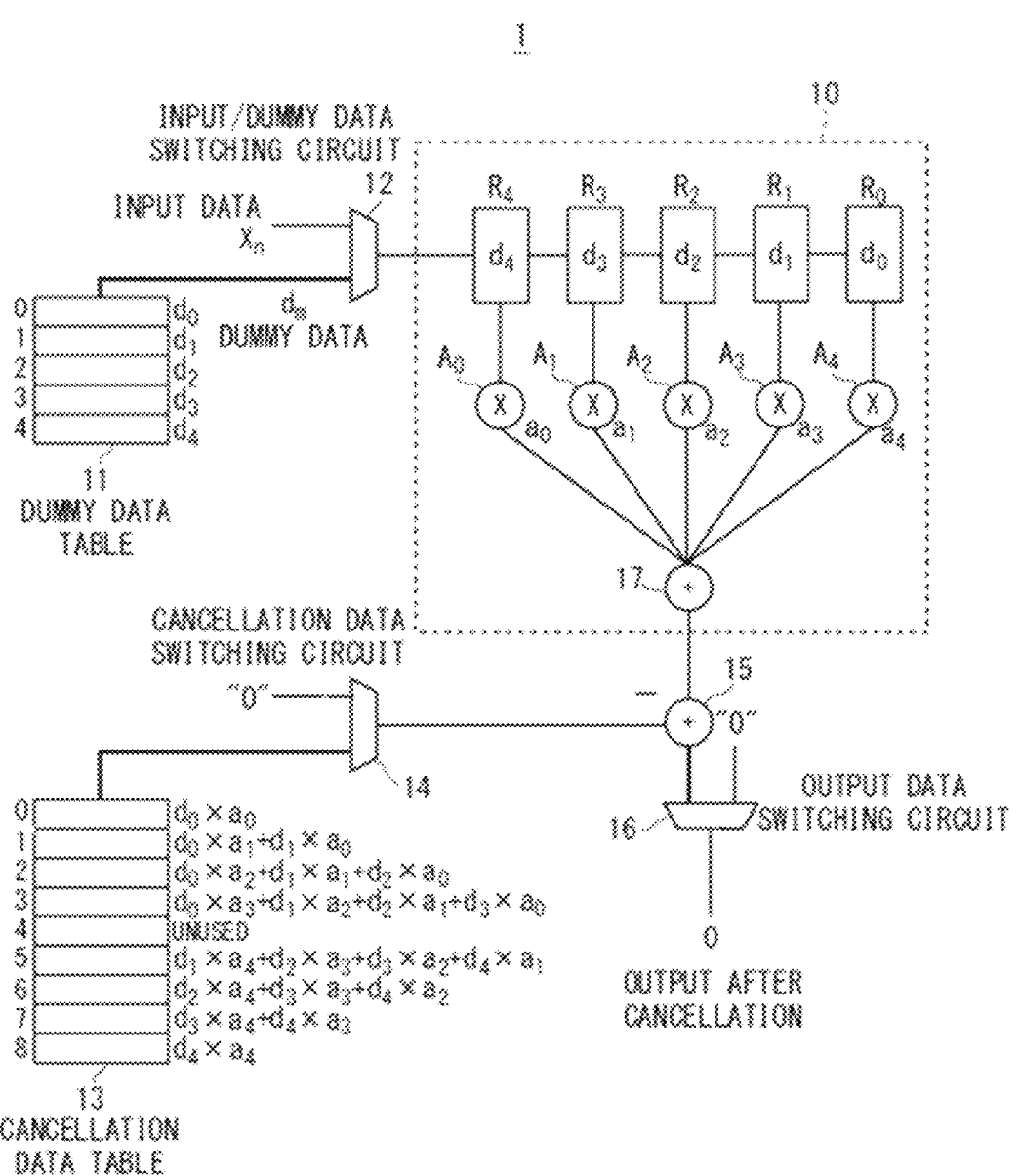
FIG. 4 is a diagram showing an operation of the arithmetic processing apparatus according to the second example embodiment of the present disclosure.

Next, FIG. 4 shows a state in which the dummy data pieces $d_0$ to $d_4$ are stored respectively in the delay elements $R_0$ to $R_4$ of the FIR filter 10. It is preferable that the output of the FIR filter becomes zero at a point in time when the dummy data $d_0$ to $d_4$ for the five taps are stored in the delay elements $R_0$ to $R_4$, respectively. Therefore, the output data switching circuit 16 selects zero and then outputs it.

At this time, the value of the dummy data table 11 is repeatedly input while the input data is zero. That is, in Expression (2), the process is repeated until n=(n+1) mod (N−1).

At this time, by sequentially inputting dummy data in the dummy data table 11 to the FIR filter 10 at each unit time, the in-filter adder 17 of the FIR filter 10 is operated and thus the current can be continuously consumed without any extreme change therein.

Figure 5:
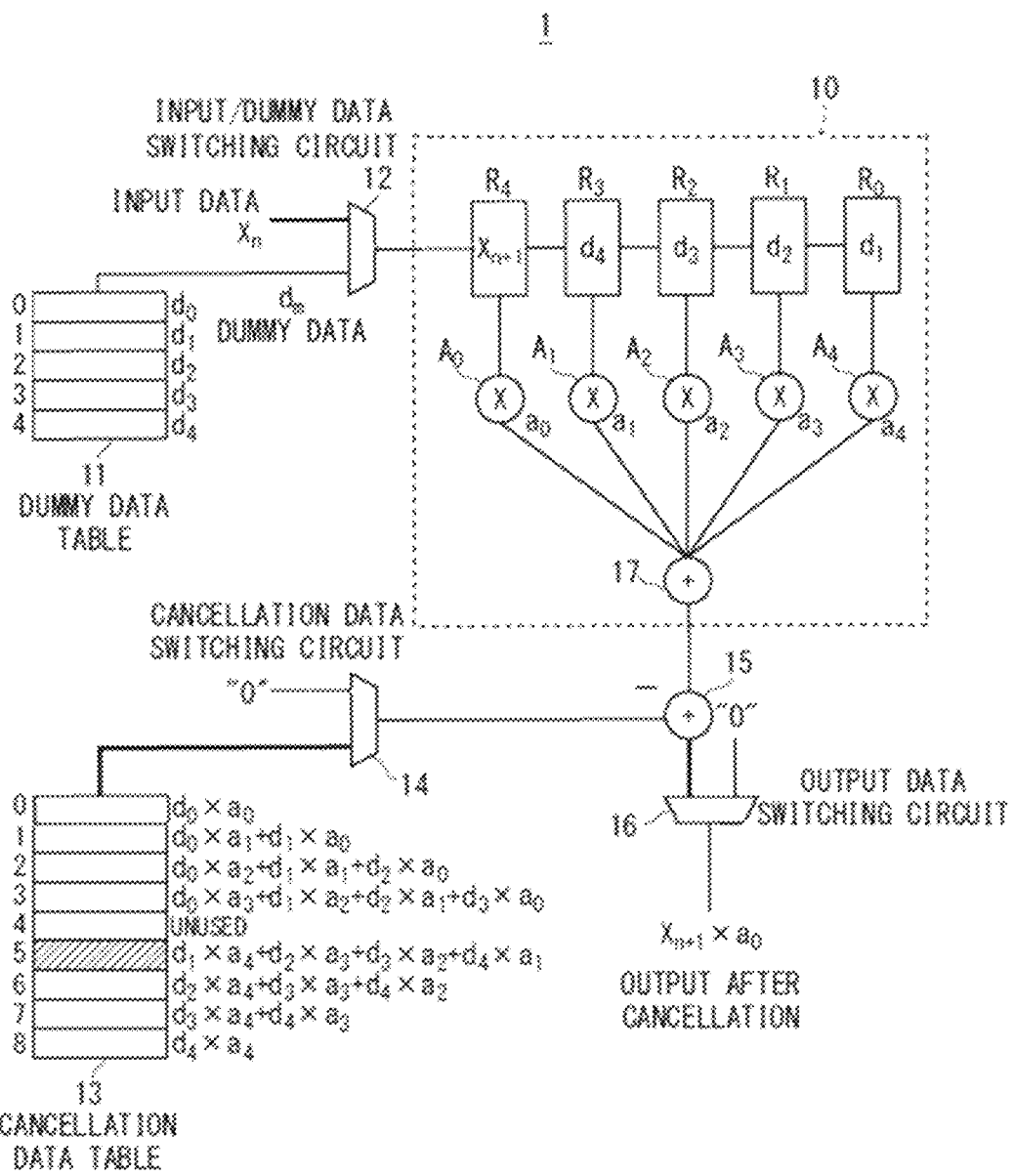
FIG. 5 is a diagram showing an operation of the arithmetic processing apparatus according to the second example embodiment of the present disclosure.

Further, FIG. 5 shows a state when an input of the input data $X_n$ is started again from a state in which an input is zero. The input/dummy data switching circuit 12 selects the input data $X_n$ and outputs the selected data to the FIR filter 10. Further, the cancellation data switching circuit 14 selects cancellation data of the cancellation data table 13 and outputs the selected data to the adder 15 for cancellation. The adder 15 for cancellation subtracts the output from the FIR filter 10 by using the cancellation data output from the cancellation data switching circuit 14, whereby an output component caused by dummy data remaining in the FIR filter 10 is canceled. At this time, the output data switching circuit 16 selects the output from the adder 15 for cancellation and then outputs it.

Figure 6:
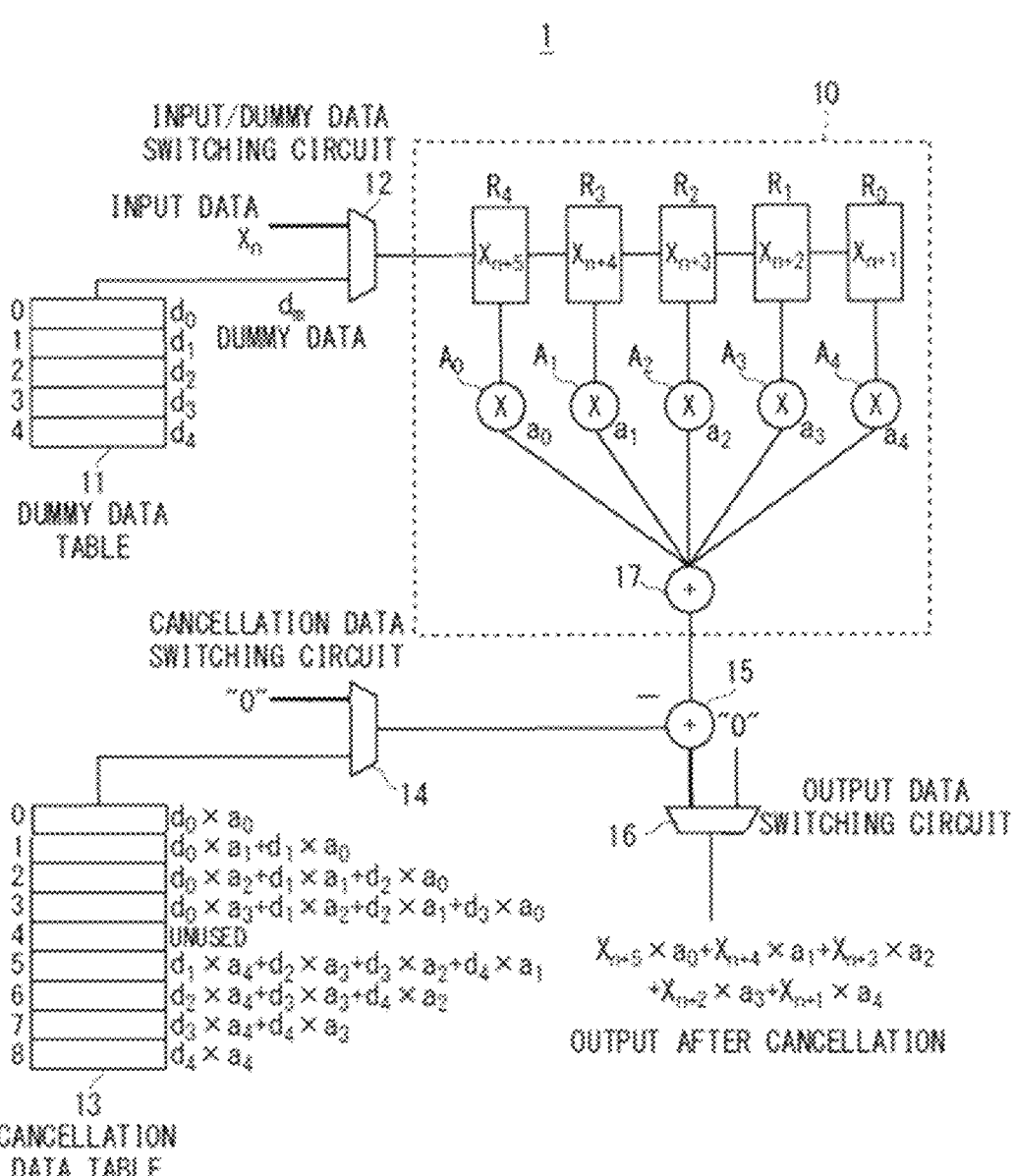
FIG. 6 is a diagram showing an operation of the arithmetic processing apparatus according to the second example embodiment of the present disclosure.

Lastly, FIG. 6 shows a state in which all the dummy data pieces are eliminated from the delay elements $R_0$ to $R_4$ inside the FIR filter 10 and input data pieces $X_n+1$ to $X_{n+5}$ are entered in the delay elements $R_0$ to $R_4$, respectively. At this time, it is not necessary to cancel an output component caused by the dummy data. Therefore, the cancellation data switching circuit 14 selects zero and then outputs it. That is, at a point in time when n=N−1 in Expression (1), the cancellation data switching circuit 14 selects zero and then outputs it.

By the arithmetic processing apparatus 1 according to this example embodiment, it is possible to prevent there being any time when there is no input to the FIR filter 10. Thus, the arithmetic circuit and the delay elements $R_0$ to $R_4$ continue the switching operations, and the power consumption becomes equal to that in a normal operation. Therefore, the power consumption in the FIR filter 10 is smoothed (i.e., stabilized).

The current of the input/dummy data switching circuit 12 and the cancellation data switching circuit 14 for selecting data from the dummy data table 11 and the cancellation data table 13 respectively and outputting the selected data is smaller than the current consumed by the FIR filter 10 itself. Therefore, by providing a circuit that inputs dummy data and a circuit that cancels an output component caused by the dummy data, it is possible to smooth (i.e., stabilize) the power consumption of the circuit.

As described above, by providing a circuit that inputs dummy data while there is no input to a digital filter and a circuit that cancels the influence of inputting the dummy data on the output of the digital filter, it is possible to smooth (i.e., stabilize) the power consumption of the arithmetic processing apparatus 1.

Other Example Embodiments

Figure 8:
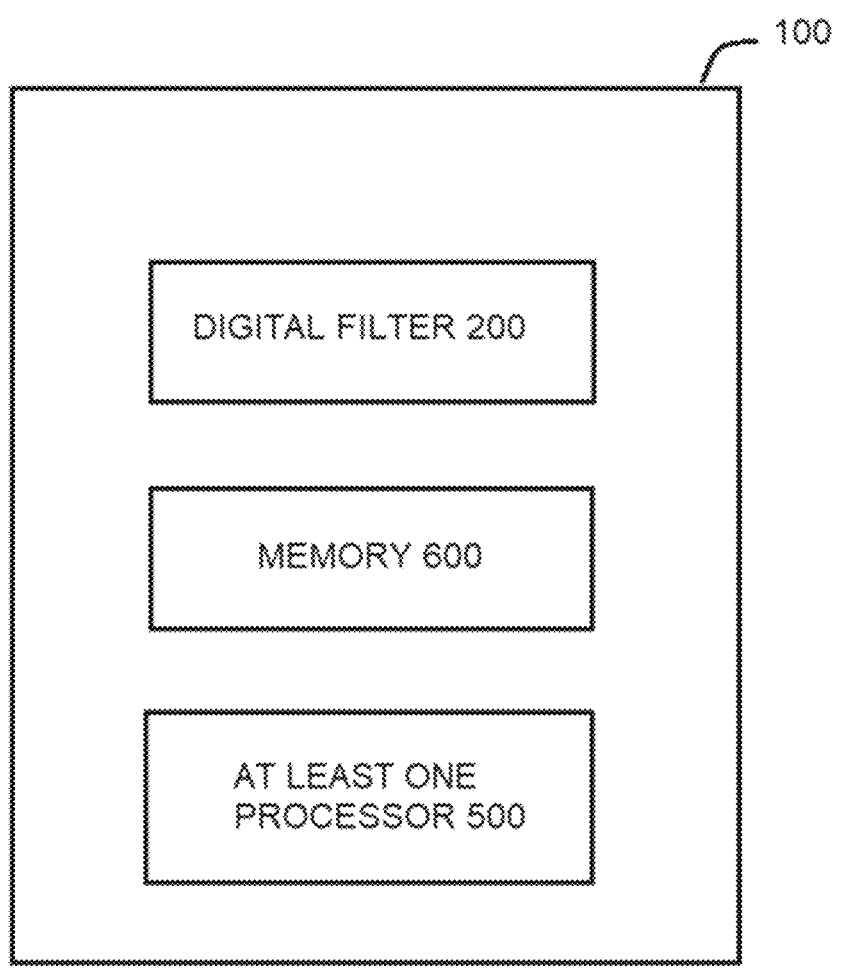
FIG. 8 is a block diagram of an arithmetic processing apparatus according to an example embodiment of the present disclosure.

FIG. 8 is a block diagram of an arithmetic processing apparatus according to an example embodiment. As shown in FIG. 8, an arithmetic processing apparatus 100 may comprise a digital filter 200, a memory 600 and at least one processor 500.

Although the present disclosure has been described as a hardware configuration in the above-described example embodiments, the present disclosure is not limited thereto. The arithmetic processing apparatus 1 according to the present disclosure may be applied as, for example, an arithmetic processing method. That is, the arithmetic processing method includes inputting dummy data to a digital filter when there is no input data input to the digital filter, and performing, on output data output from the digital filter, arithmetic processing for canceling an output component caused by the dummy data.

All or part of the arithmetic processing apparatus 1 can be implemented by hardware circuitry, software process or a combination thereof. Further, in the present disclosure, all or part of processing in the arithmetic processing apparatus 1 can be implemented by causing a Central Processing Unit (CPU) to execute a computer program.

In the above-described examples, the program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g., magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

The above-described program is an arithmetic processing program for causing the arithmetic processing apparatus 1 to input dummy data to a digital filter when there is no input data input to the digital filter, and perform, on output data output from the digital filter, arithmetic processing for canceling an output component caused by the dummy data.

While the disclosure has been particularly shown and described with reference to example embodiments thereof, the disclosure is not limited to these example embodiments. It will be understood by those of ordinary skill in the art that various changes in form and details may be made therein without departing from the spirit and scope of the present disclosure as defined by the claims.

According to the present disclosure, it is possible to prevent a rapid increase or decrease in a current in a device using a large number of digital filters.

What is claimed is:

1. An arithmetic processing apparatus comprising:
a digital filter;
at least one memory storing instructions; and
at least one processor configured to execute the instructions to:
in a first case where there is no input data that is input to the digital filter,
input dummy data to the digital filter, and
perform, on output data that is output from the digital filter, arithmetic processing for canceling an output component caused by the dummy data; and
in a second case where the at least one processor is not able to determine whether or not there is no input data that is input to the digital filter,
calculate a signal power of an input signal that is input to a buffer configured to transmit the input data, and
in a case where the calculated signal power of the input signal is equal to or less than a threshold, input the dummy data to the digital filter.

2. The arithmetic processing apparatus according to claim 1, wherein the at least one memory further stores a dummy data table that stores the dummy data.

3. The arithmetic processing apparatus according to claim 1, wherein the at least one memory further stores a cancellation data table that stores cancellation data used for the arithmetic processing for canceling the output component caused by the dummy data.

4. The arithmetic processing apparatus according to claim 1, wherein the digital filter is a Finite Impulse Response (FIR) filter.

5. The arithmetic processing apparatus according to claim 4, wherein when the dummy data are stored respectively in delay elements included in the FIR filter, zero is output as the output data.

6. An arithmetic processing method comprising:
in a first case where there is no input data that is input to the digital filter,
inputting dummy data to a digital filter, and
performing, on output data that is output from the digital filter, arithmetic processing for canceling an output component caused by the dummy data; and
in a second case where the at least one processor is not able to determine whether or not there is no input data that is input to the digital filter, calculating a signal power of an input signal that is input to a buffer configured to transmit the input data, and in a case where the calculated signal power of the input signal is equal to or less than a threshold, inputting the dummy data to the digital filter.

7. A non-transitory computer readable medium storing a program for causing an arithmetic processing apparatus to:

in a first case where there is no input data that is input to the digital filter, input dummy data to the digital filter, and perform, on output data that is output from the digital filter, arithmetic processing for canceling an output component caused by the dummy data; and in a second case where the at least one processor is not able to determine whether or not there is no input data that is input to the digital filter, calculate a signal power of an input signal that is input to a buffer configured to transmit the input data, and in a case where the calculated signal power of the input signal is equal to or less than a threshold, input the dummy data to the digital filter.

\*    \*    \*    \*    \*